(12) United States Patent
Elwan et al.

(10) Patent No.: US 7,592,863 B2
(45) Date of Patent: Sep. 22, 2009

(54) OPTIMIZED GAIN FILTERING TECHNIQUE WITH NOISE SHAPING

(75) Inventors: Hassan Elwan, Lake Forest, CA (US);
Amr Fahim, Newport Beach, CA (US);
Edward Youssounan, Irvine, CA (US);
Ahmed A. Emira, Lake Forest, CA (US); Dejun Wang, Irvine, CA (US)

(73) Assignee: Newport Media, Inc., Lake Forest, CA (US)

( * ) Notice: Subject to any disclaimer, the term of this patent is extended or adjusted under 35 U.S.C. 154(b) by 0 days.

(21) Appl. No.: 11/755,125

(22) Filed: May 30, 2007

(65) Prior Publication Data

US 2008/0297239 A1 Dec. 4, 2008

(51) Int. Cl.
*H03K 5/00* (2006.01)
(52) U.S. Cl. .................... 327/552; 327/559
(58) Field of Classification Search ......... 327/551–559, 327/530–532
See application file for complete search history.

(56) References Cited

U.S. PATENT DOCUMENTS 4,186,250 A * 1/1980 Garrett et al. ............... 430/302

| | | | | |
|---|---|---|---|---|
| 5,890,058 | A * | 3/1999 | Ueno et al. | 455/73 |
| 7,088,985 | B2 * | 8/2006 | Ismail | 455/339 |
| 2001/0038309 | A1 | 11/2001 | Hagemeyer | |
| 2003/0224752 | A1 | 12/2003 | Rawlins et al. | |
| 2004/0219898 | A1 | 11/2004 | Bult et al. | |
| 2005/0107055 | A1 | 5/2005 | Bult et al. | |
| 2005/0107064 | A1 | 5/2005 | Ismail | |
| 2005/0189969 | A1 | 9/2005 | Nicholas | |
| 2006/0068749 | A1 | 3/2006 | Ismail et al. | |

* cited by examiner

*Primary Examiner*—Dinh T. Le
(74) *Attorney, Agent, or Firm*—Rahman LLC (57) ABSTRACT

A noise shaping and voltage gain filtering third order electrical circuit and method comprises at least one pair of input resistors; a Frequency Dependent Negative Resistance (FDNR) filter positioned in between the at least one pair of input resistors; a feedback resistor; and an amplifier operatively connected to the feedback resistor and the at least one pair of input resistors, wherein as an electrical signal is introduced to the electrical circuit, the FDNR filter is adapted to filter signal blockers out of the electrical signal prior to the electrical signal reaching the amplifier for signal amplification, wherein the FDNR filter does not contribute noise to a signal-to-noise ratio (SNR) of the electrical signal, and wherein a transfer function of the FDNR filter is substantially elliptical in shape.

20 Claims, 10 Drawing Sheets

FULLY DIFFERENTIAL

FIG. 1 (PRIOR ART)

* LARGE BLOCKER= TOUGH LINEARITY SPEC
* LIMITED AMPLIFICATION
* LINEARITY DEMAND ON FILTER IS STRINGENT

FIG. 2(A) (PRIOR ART)

* FILTER NOISE SPEC IS STRINGENT
* FILTER AREA IS LARGE

FIG. 2(B) (PRIOR ART)

* LINEARITY / NOISE TRADEOFF LIMITS FIRST
  AMPLIFIER AND FILTER

Noise Shaping
FIG. 4

FILTER TRANSFER FUNCTION

OPTIMIZED GAIN FILTERING TECHNIQUE WITH NOISE SHAPING

BACKGROUND

1. Technical Field

The embodiments herein generally relate to electrical filtering technologies, and, more particularly, to electrical gain filtering and noise shaping technologies.

2. Description of the Related Art

Active filters are often realized using transconductance-C (gm-c) topologies or op-amp based resistor/capacitance (RC) topologies. There are many ways to implement higher order filters using these two techniques. However both techniques tend to suffer from a limited noise performance. This is because the active and passive components employed in both techniques are in the signal path. Thus, they directly add noise to the signal at all frequencies (no noise shaping is employed). Hence, to achieve an acceptable post down-conversion mixer low noise filter topology using those techniques leads to an unacceptable power and chip area penalties.

Furthermore, for best dynamic range performance gain and filtering should be interleaved. Moreover, for best linearity the out of band signals should be filtered first. However, for best noise performance, the signal needs to be amplified first before filtering. Hence, a fundamental trade-off exists between cascading filter and gain stages.

The disadvantages of these techniques are: (1) higher noise that prevents higher order filters from being used in low noise application (such as a post-mixer amplifier in a wireless integrated receiver); (2) high linearity demands on the amplifiers used, especially the amplifier preceding the first filter stage; (3) larger chip area and power consumption are required to achieve a high dynamic range; and (4) the filter circuitry is in the signal path and hence contributes to degrading noise, offset, and matching.

Figure 1:
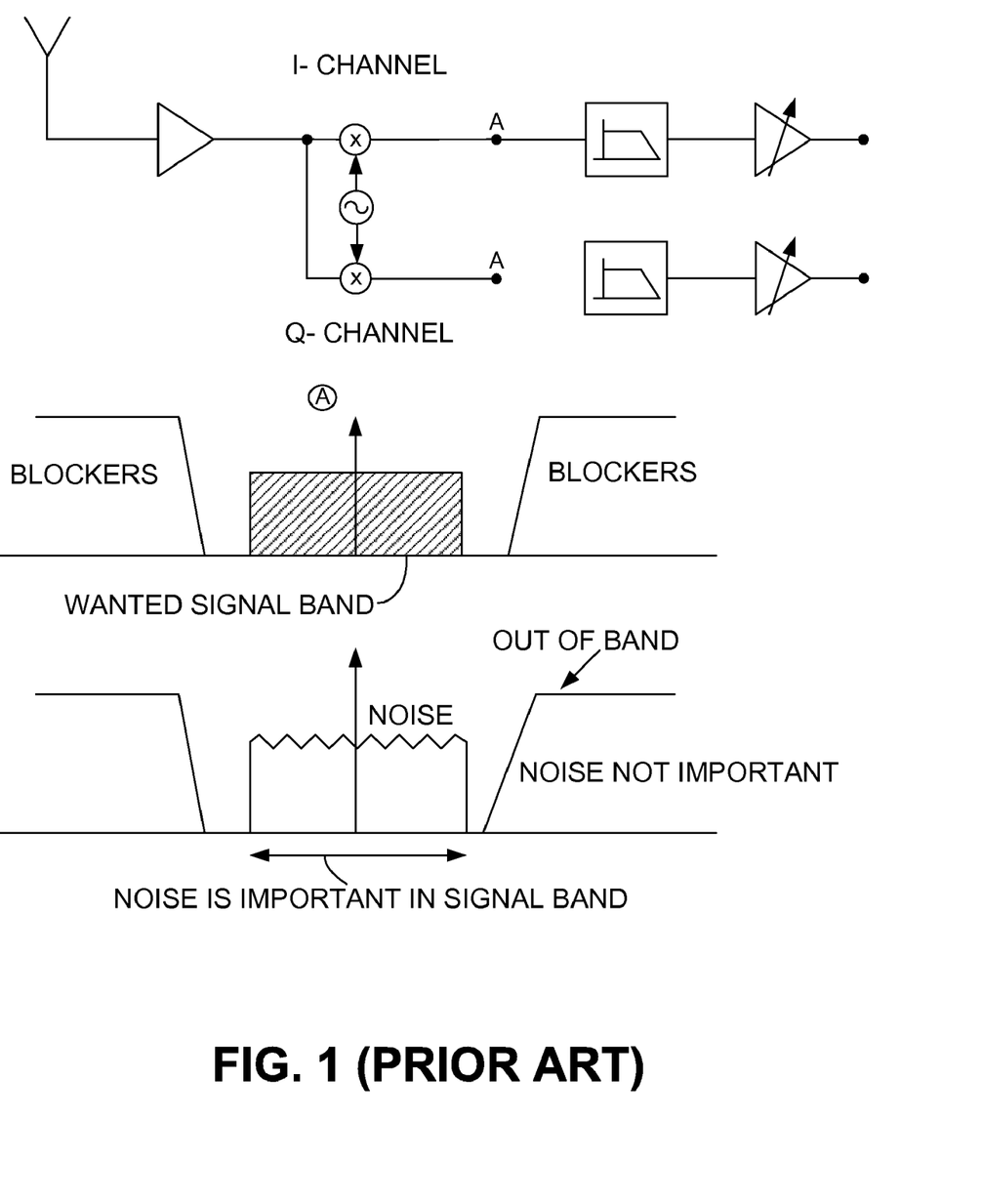
Figure 2A:
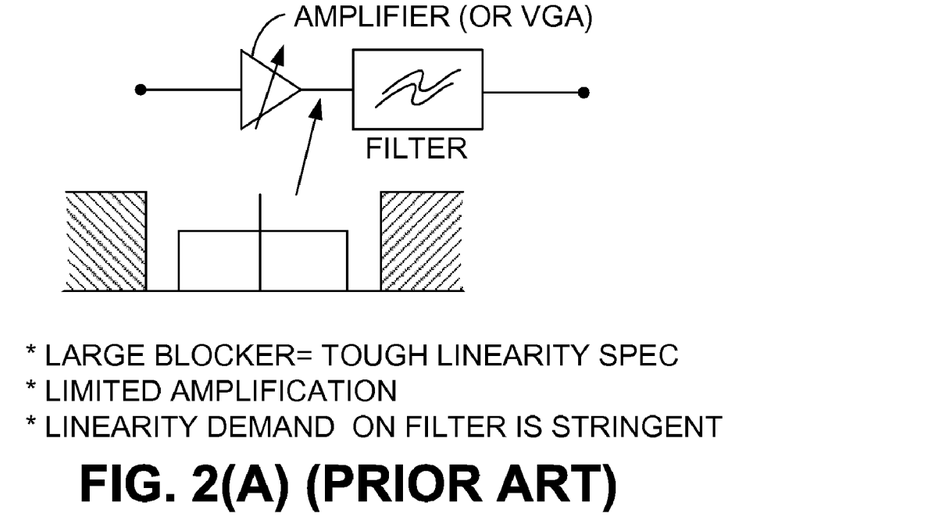
Figure 2B:
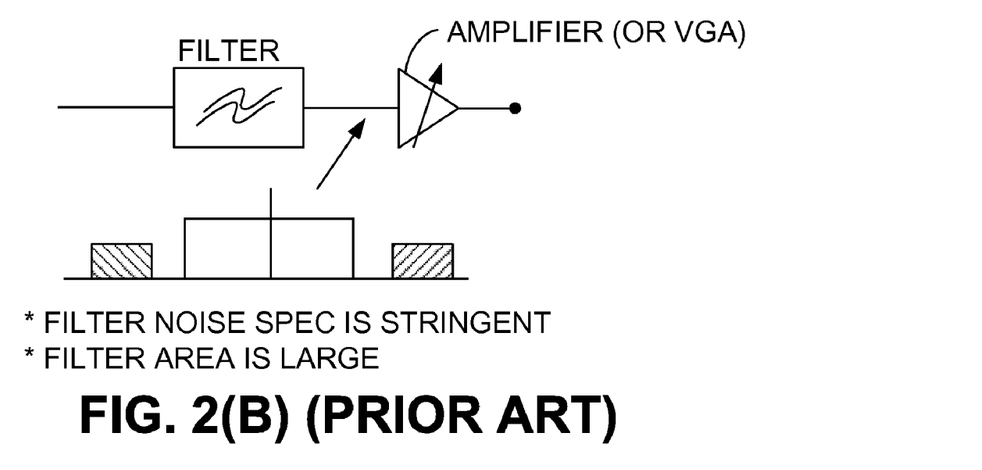
Figure 2C:
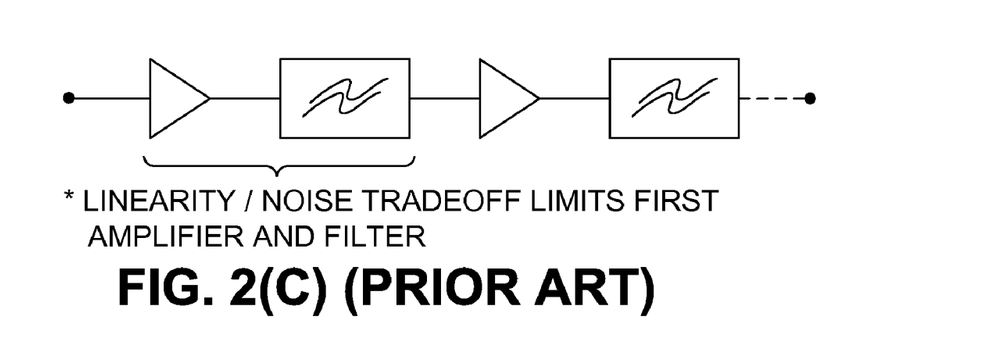

In many applications it is required to amplify a desired signal that occupies a specific frequency band while simultaneously attenuating all unwanted signals outside the desired signal band. A wireless system, in general, is one category of such a system. In integrated wireless receivers the desired signal is down-converted to the baseband frequency together with many unwanted blockers as shown in FIG. 1. The baseband section usually is required to amplify the unwanted signal, reject (filter out) the unwanted blockers, and demodulate the signal to recover the information. The problem facing integrated wireless receivers is that RF front-ends do not have any selectivity and hence the entire filtering operation should be performed at baseband. The RF section also can only provide a limited gain to the desired signal (due to the existence of blockers). Hence, the baseband filtering should add minimal noise to the signal. Accordingly, the traditional trade-off in receiver design arises. From a noise perspective, it is usually better to use amplifiers before filtering, however this places a big demand on the amplifier and the filter linearity spec (as shown in FIG. 2(A)). Another approach, as shown in FIG. 2(B), is to relax the linearity requirement by first filtering out the signal then amplifying it. However, this places a stringent noise requirement on the filter used. Hence, the overall dynamic range is limited either by linearity or by noise. Therefore, implementing higher dynamic range filters/amplifiers leads to more power consumption and larger die area. FIG. 2(C) shows a gain filter interleaved stages. This is an attempt to do some filtering followed by gain then more filtering followed by more gain and so on. This allows the linearity and noise to be traded off. Nevertheless, the first gain stage and first amplification stage in this topology are still going to be challenging. Furthermore, in all the configurations shown in FIGS. 2(A) through 2(C) the filter stages contribute to the overall offset and (I/Q) matching of the receiver. Therefore, there remains a need for a new gain filtering and noise shaping technique capable of minimizing the requisite chip area and power consumption levels.

SUMMARY

In view of the foregoing, an embodiment provides a noise shaping and voltage gain filtering electrical circuit comprising an input terminal adapted to receive an input electrical signal; a pair of input resistors operatively connected to the input terminal; a filter positioned in between the pair of input resistors and adapted to filter the electrical signal; a feedback resistor; and an amplifier adapted to amplify the electrical signal, wherein the amplifier is operatively connected to the feedback resistor and one of the input resistors, wherein when the input terminal receives the input electrical signal, the filter creates a short circuit at an out of band region of the electrical signal thereby filtering signal blockers out of the electrical signal prior to the electrical signal reaching the amplifier, and wherein the short circuit causes the filter to refrain from contributing noise to a signal-to-noise ratio (SNR) of the electrical signal.

The circuit may be arranged in each of a plurality of cascading transconductance stages, wherein the filter of a first stage is adapted to control a SNR of the electrical signal in successive stages. Preferably, the filter comprises a signal path and a signal blocker path, wherein the filter may comprise a Frequency Dependent Negative Resistance (FDNR) circuit positioned only along the signal blocker path; a resistor in series with the FDNR circuit; and a capacitor in parallel with the FDNR circuit and the resistor, wherein noise generated by the FDNR circuit and the resistor is high pass filtered by the capacitor thereby moving the noise to the out of band region of the electrical signal.

Moreover, the total capacitance in the FDNR circuit may comprise 170 pF. Additionally, the circuit may further comprise multiple pairs of input resistors, wherein a separate the filter is positioned in between all pairs of input resistors. Preferably, the amplifier comprises any of an operational amplifier, a variable gain amplifier, a trans-resistance amplifier, and a current mode amplifier.

Another embodiment provides a noise shaping and voltage gain filtering third order electrical circuit comprising at least one pair of input resistors; a FDNR filter positioned in between the at least one pair of input resistors; a feedback resistor; and an amplifier operatively connected to the feedback resistor and the at least one pair of input resistors, wherein as an electrical signal is introduced to the electrical circuit, the FDNR filter is adapted to filter signal blockers out of the electrical signal prior to the electrical signal reaching the amplifier for signal amplification, wherein the FDNR filter does not contribute noise to a SNR of the electrical signal, and wherein a transfer function of the FDNR filter is substantially elliptical in shape.

Furthermore, the circuit may be arranged in each of a plurality of cascading transconductance stages, wherein the FDNR filter of a first stage is adapted to control a SNR of the electrical signal in successive stages. Preferably, the FDNR filter comprises a signal path and a signal blocker path, wherein the FDNR filter may comprise a FDNR circuit positioned only along the signal blocker path; a resistor in series with the FDNR circuit; and a capacitor in parallel with the FDNR circuit and the resistor, wherein noise generated by the FDNR circuit and the resistor is high pass filtered by the capacitor thereby moving the noise to an out of band region of the electrical signal.

Also, the total capacitance in the FDNR circuit may comprise 170 pF. Moreover, the circuit may further comprise multiple pairs of input resistors, wherein a separate the FDNR filter is positioned in between all pairs of input resistors. Preferably, the amplifier comprises any of an operational amplifier, a variable gain amplifier, a trans-resistance amplifier, and a current mode amplifier.

Another embodiment provides a method of noise shaping and voltage gain filtering an electrical signal, wherein the method comprises inputting an electrical signal in an electrical circuit; passing the electrical signal through a pair of input resistors; filtering the electrical signal in a filter positioned in between the pair of input resistors such that the filter creates a short circuit at an out of band region of the electrical signal thereby filtering signal blockers out of the electrical signal, wherein the short circuit causes the filter to refrain from contributing noise to a SNR of the electrical signal; and amplifying the filtered electrical signal in an amplifier that is operatively connected to a feedback resistor and one of the input resistors.

The method may further comprise arranging the electrical circuit in each of a plurality of cascading transconductance stages, wherein the filter of a first stage is adapted to control a SNR of the electrical signal in successive stages. Moreover, the method may further comprise configuring the filter with a signal path and a signal blocker path, wherein in the filter, the method may further comprise positioning a FDNR circuit only along the signal blocker path; positioning a resistor in series with the FDNR circuit; positioning a capacitor in parallel with the FDNR circuit and the resistor; and using the capacitor to high pass filter noise generated by the FDNR circuit thereby moving the noise to the out of band region of the electrical signal. Additionally, the method may further comprise passing the electrical signal through multiple pairs of input resistors; and positioning a separate filter in between all pairs of input resistors. Moreover, the method preferably comprises configuring the amplifier as any of an operational amplifier, a variable gain amplifier, a trans-resistance amplifier, and a current mode amplifier.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIGS. 1 through 2(C) illustrate schematic electrical block diagrams of conventional filtering and amplification circuits;

DETAILED DESCRIPTION OF PREFERRED EMBODIMENTS

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

As mentioned, there remains a need for a new gain filtering and noise shaping technique capable of minimizing the requisite chip area and power consumption levels. The embodiments herein achieve this by providing a new technique to realize amplifiers with inherent noise shaped filters. More particularly, the embodiments herein provide a transconductance stage that implements amplification and filtering simultaneously. The filtering operation in this stage does not contribute to the noise in the desired signal band and rejects the blockers before they reach any of the amplification stages. Furthermore, the filter components do not contribute any offsets or mismatches to the receiver path. Referring now to the drawings, and more particularly to FIGS. 3(A) through 9, where similar reference characters denote corresponding features consistently throughout the figures, there are shown preferred embodiments.

Figure 3A:
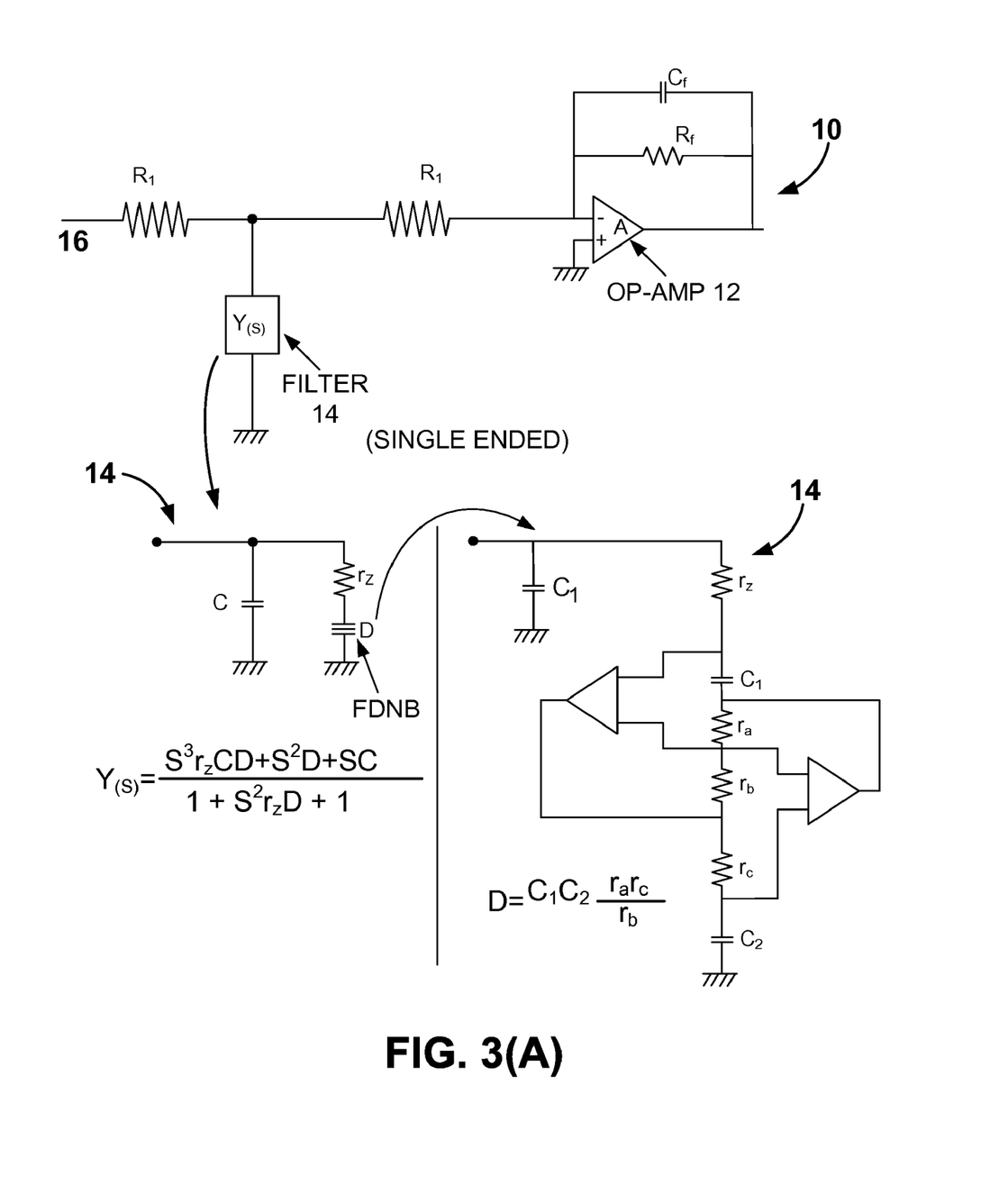
FIGS. 3(A) and 3(B) are schematic electrical circuit diagrams illustrating a noise shaped filtering and amplification circuit according to an embodiment herein.
Figure 3B:
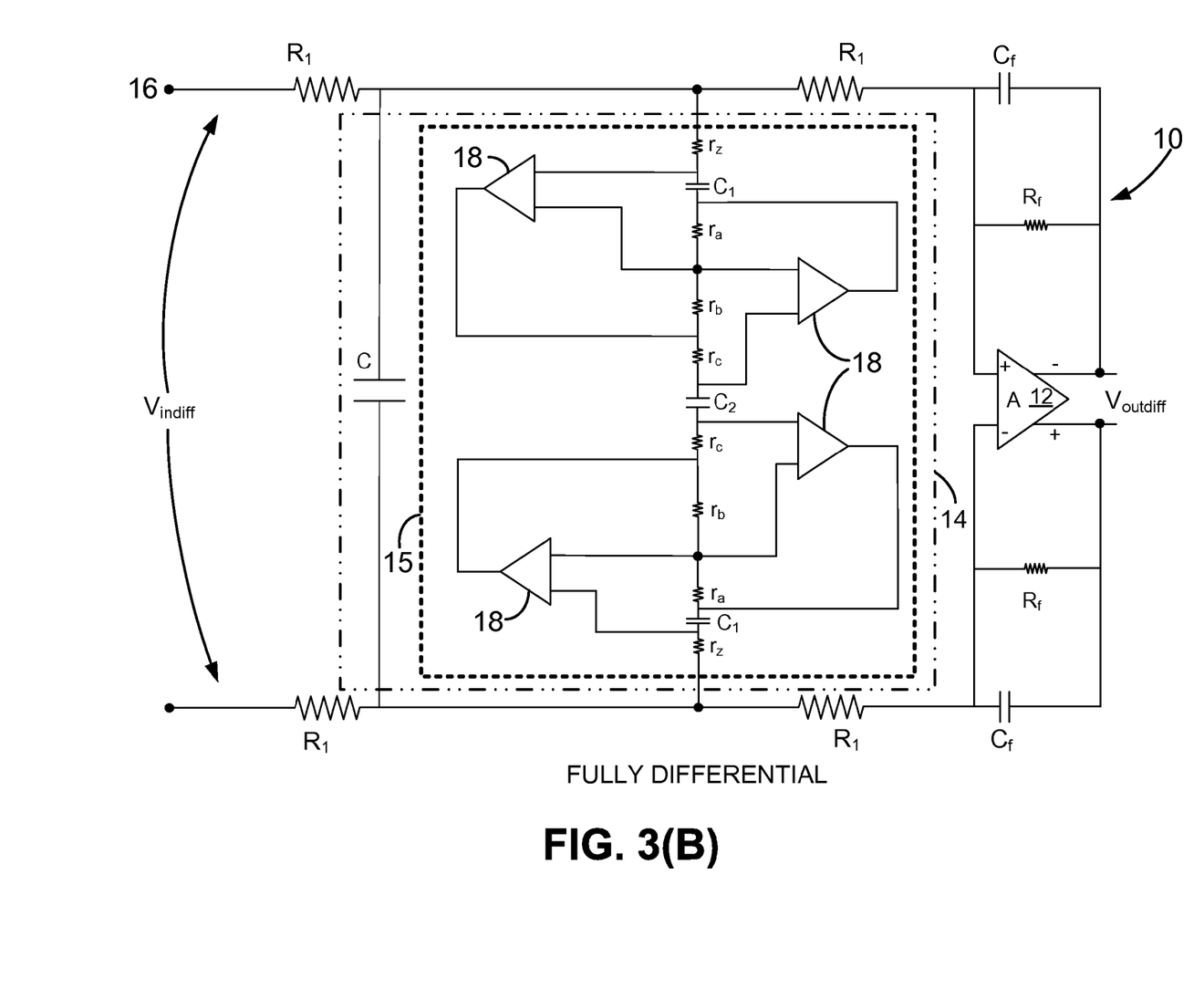

FIGS. 3(A) and 3(B) illustrate a transconductance stage circuit 10 combining noise shaped filtering and amplification. The circuit 10 comprises an operational amplifier (op-amp) 12 that realizes the main amplifier stage with the feedback resistance $R_f$ and input resistance $R_1$. The filtering stage 14 is placed in between the input resistance $R_1$. When the signal is applied to the input terminal 16, the filter 14 provides a short circuit at the out of band (higher frequency) region. Thus, the blockers are filtered out before reaching the main amplifier 12. Thus, the linearity spec of the amplifier 12 is relaxed. Furthermore, since the blockers are attenuated, the amplifier gain can be increased as necessary to amplify the desired signal to an acceptable value. Moreover, the amplifier gain value does not have to be limited by the presence of a large blocker. This relaxes the noise spec of all stages following the circuit 10. While this filtering technique relaxes the linearity spec, it does not impact the noise of the stage (as traditional filters would do) because of the noise shaping of the passive and active component noise and as further demonstrated below in experimental results.

The filter shown in FIG. 3(B), in particular, realizes a third-order response with a notch (transfer function zero). The Frequency Dependent Negative Resistance (FDNR) realization 15 is shown more clearly in FIG. 3(B). The filter 14 uses a FDNR 15, capacitors $C_1$, $C_2$ and resistors $r_a$, $r_b$, $r_c$, $r_z$ to realize the filter transfer function. According to the embodiments herein, the FDNR 15 is not in the signal path, rather it is in the blocker path. The FDNR op-amp noise as well as resistor noise is high pass filtered by the capacitor $C_1$. Hence, by properly choosing the value of $C_1$, the noise generated by the FDNR 15 is moved out of the band of the signal. Furthermore, the DC offset of the amplifiers 18 used in the FDNR circuit 15 is blocked by the capacitor $C_1$ as well. Hence, the amplifiers 18 contribute no extra DC offset to the signal path. Finally, in the case where this stage is used in a wireless receiver path with I and Q channels, matching within the signal band is limited by the passive components $R_1$, $R_f$ and the main amplifier 12. The FDNR 15 is again out of the signal path in the band of interest, and hence does not contribute any mismatches between the I and Q paths. Since the noise generated by the FDNR resistors $r_a$, $r_b$, $r_c$, $r_z$ are shaped, this enables one to use larger resistors (noisier) and hence reduce the capacitor $C_1$, $C_2$ sizes. This results in significant chip area savings especially for low noise applications where for classical filter techniques low values of resistors have to be used and hence large capacitors result. Additionally, capacitor $C_f$ adds an extra passive pole for filtering as well.

The circuit 10 can also employ variable gain amplifiers with gain that is programmed by using resistor arrays ($R_1$ or $R_f$); preferably $R_f$ is tuned while $R_1$ is kept constant because this maintains a constant filter transfer function for all gain values. Furthermore, resistor $R_f$ can be soft switched in the manner described in U.S. patent application Ser. No. 11/472, 138 filed on Jun. 21, 2006, the complete disclosure of which, in its entirety, is herein incorporated by reference.

Figure 4:
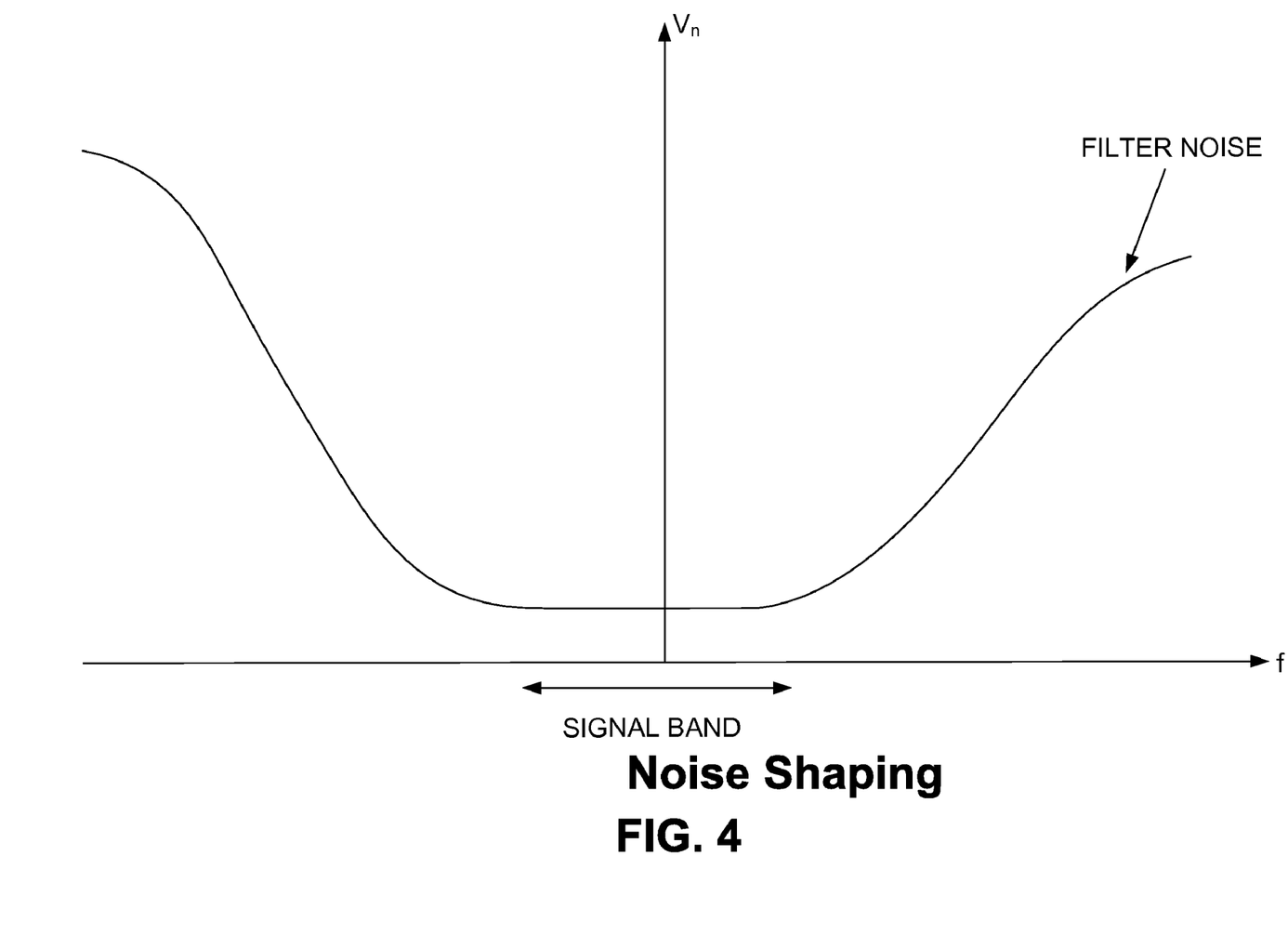
FIG. 4 is a graphical representation illustrating a noise shaping curve according to an embodiment herein.
Figure 5:
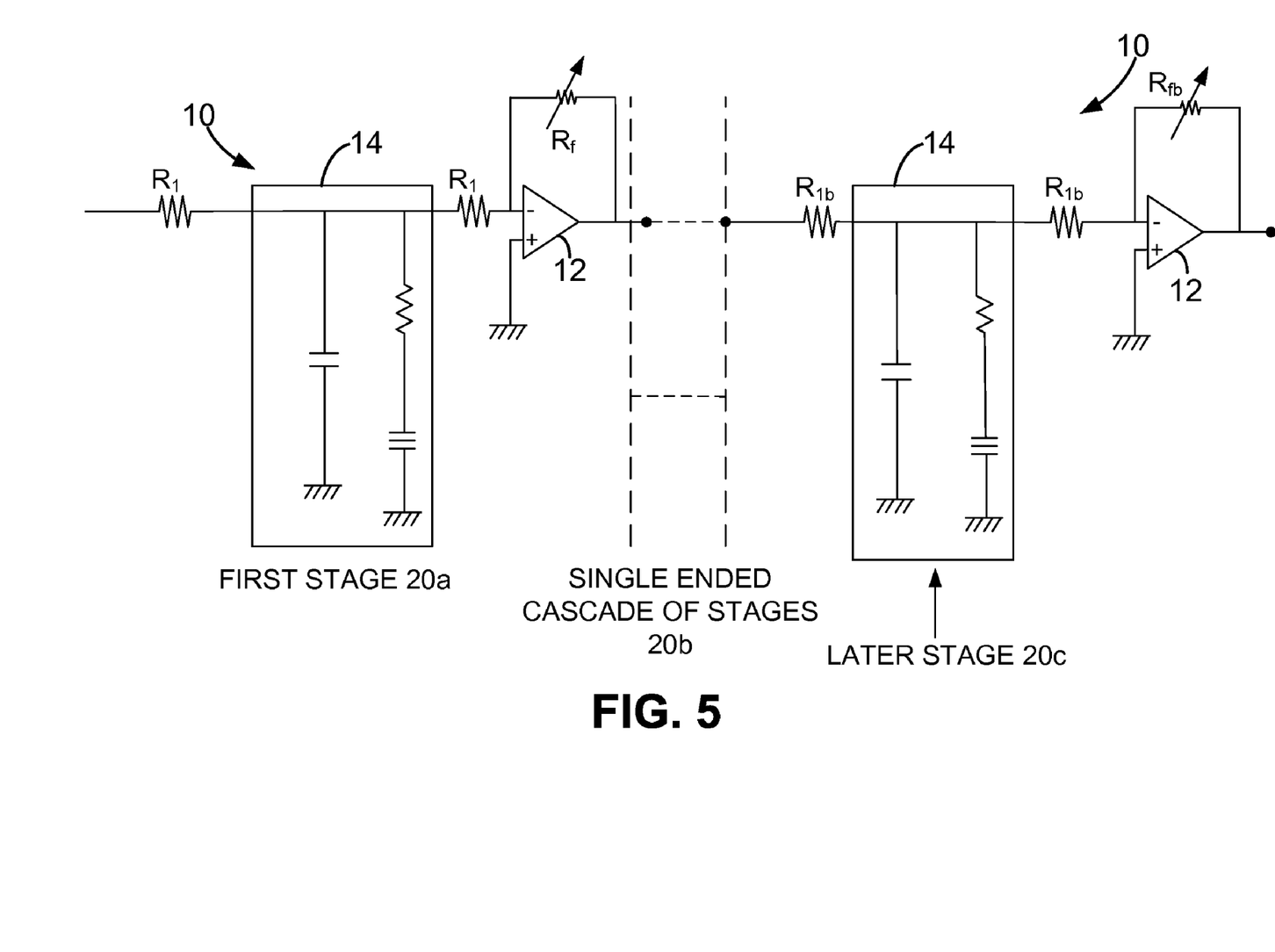
FIG. 5 is a schematic diagram illustrating a cascaded noise shaped filtering and amplification circuit according to an embodiment herein.

Thus, the circuit 10 shapes the noise generated by the filtered components outside of the band of the desired signal as shown in FIG. 4, hence the name "noise shaped filter". Accordingly, the filtered noise is outside the signal band and therefore does not contribute to the signal-to-noise ratio (SNR). The noise shaped filter realization is shown in FIG. 5, wherein the stages 20a-20c can be cascaded. Because of the presence of gain and filtering in the first stage 20a, the noise and linearity spec of all the following stages 20b, 20c are relaxed, hence the following stage 20c power, noise, and chip area can be scaled to a lower value. Thus, the embodiments herein provide a technique for efficient area and power savings to realize higher order filters with embedded amplification (or VGA) functions.

Figure 6:
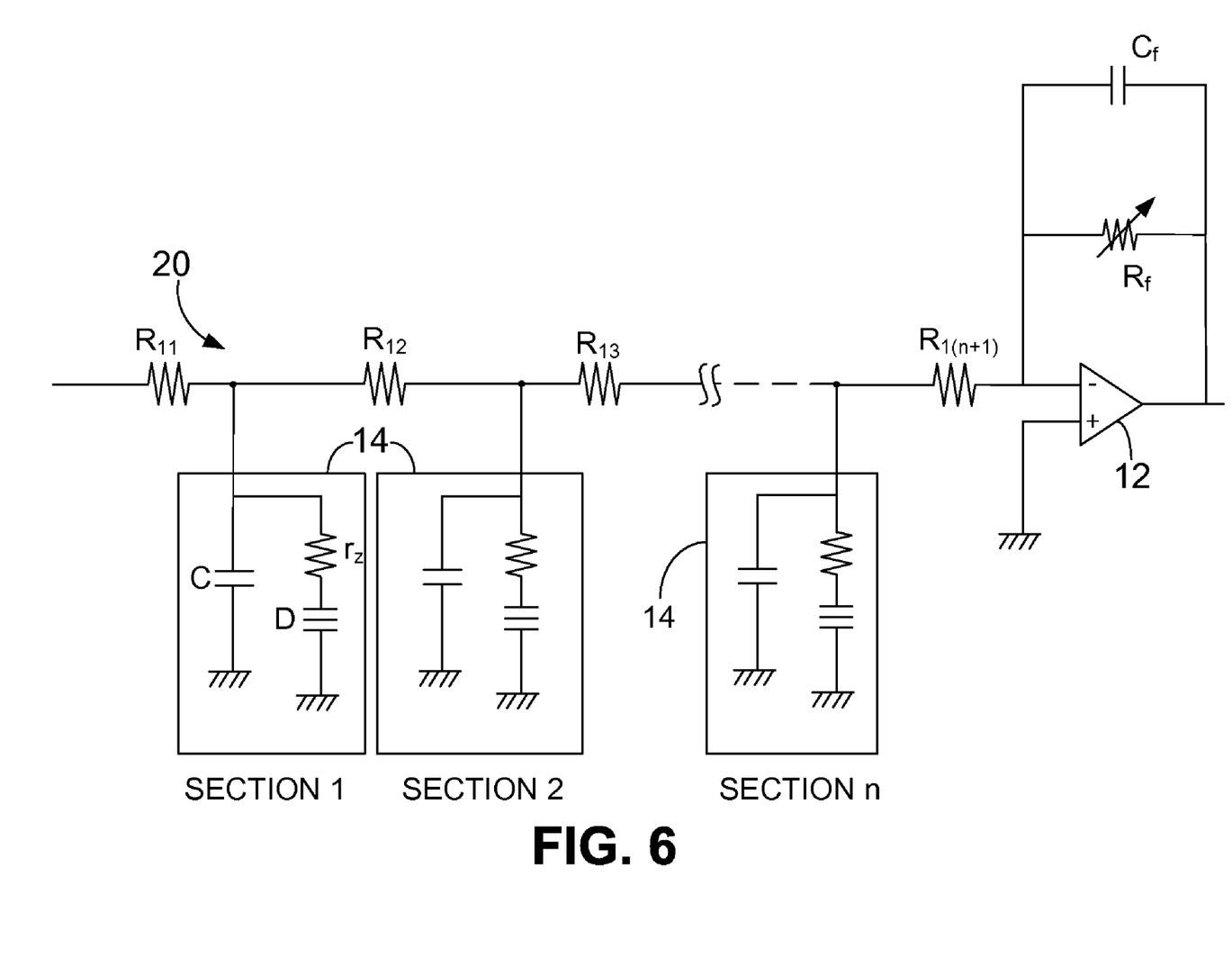
FIG. 6 is a schematic diagram illustrating a noise shape filtering and amplification circuit according to a first alternate embodiment herein.

Another manner of implementing a higher order filter is shown in the circuit 20 of FIG. 6. Here, the input resistor is divided into n+1 parts with a FDNR filter 14 placed between the resistors $R_{11}$ through $R_{1(n+1)}$. In practice, the cases of n=1 and n=2 are most preferred and result in a fifth and sixth order filter implementation per stage, respectively.

Figure 7:
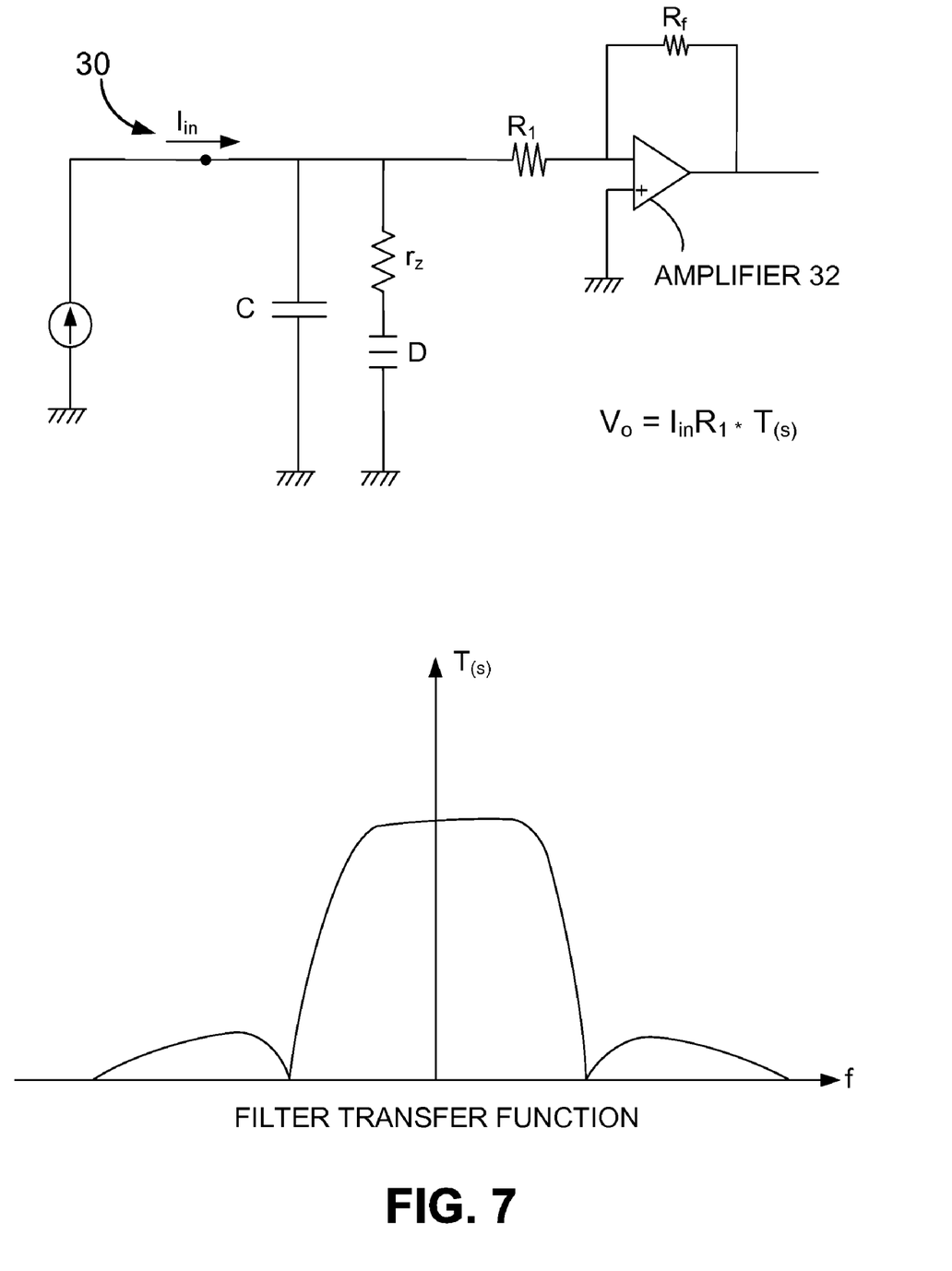
FIG. 7 is a schematic diagram illustrating a noise shape filtering and amplification circuit along with a corresponding transfer function curve according to a second alternate embodiment herein.

In an alternative embodiment, shown in FIG. 7, a circuit 30 can also be used in realizing trans-resistance amplifiers with embedded noise shaped filtering. Trans-resistance amplifiers are employed in the case when the input signal is in the current domain. The signal is amplified, filtered, and converted to voltage. An example of this situation is after the down-conversion mixers in most integrated wireless receivers as well as imager applications. In case of a current mode input, the noise of resistance $R_1$ in FIG. 7 is in series with the input current source, hence it does not add to the total noise of the system. In FIG. 7 the amplifier 32 used can be a regular op-amp, a trans-resistance amplifier, or a current mode amplifier.

Figure 8:
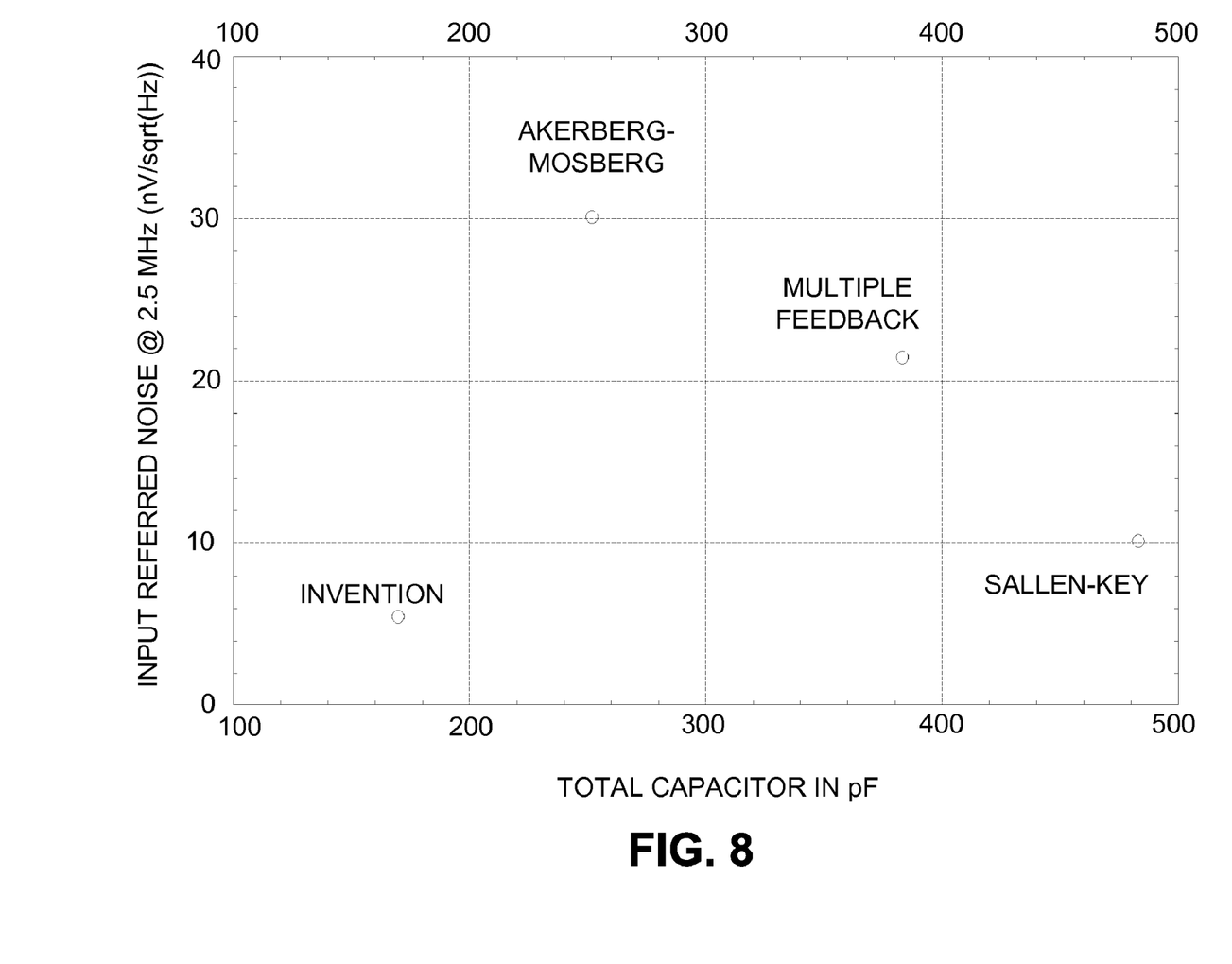
FIG. 8 is a graphical representation of results achieved by the embodiments herein compared to conventional solutions.

Table 1 below illustrates numerical differences and results achieved by the circuits 10, 20, 30 of the embodiments herein compared with well-known conventional noise shaping and/or gain filtering circuits. FIG. 8 graphically illustrates the relative differences in the capacitor area consumed on an integrated circuit chip implementing noise shaping and/or gain filtering circuits as a function of input referred noise achieved by the circuits 10, 20, 30 of the embodiments herein compared with the well-known conventional noise shaping and/or gain filtering circuits described in Table 1. As demonstrated both in FIG. 8 and Table 1, the embodiments herein achieve far superior results (i.e., better noise and capacitor area 9 chip area) for a given filter response) compared with the conventional solutions.

TABLE 1

Results achieved by the embodiments herein compared with conventional solutions

| Filter Topology | Capacitor Area | Noise added by filtering | Elliptic transfer function | Extra resistors in signal path | Extra active elements in signal path |
|---|---|---|---|---|---|
| Present Invention | 170 pF | 5 nV/Sqrt(Hz) | YES | None | None |
| Sallen-Key | 481 pF | 10 nV/sqrt(Hz) | NO | 6 | 1 |
| Multiple Feedback | 382 pF | 21 nV/sqrt(Hz) | NO | 6 | 2 |
| Akerberg-Mosberg | 250 pF | 30 nV/sqrt(Hz) | YES | 8 | 2 |

Experimentally, in order to achieve the results indicated in Table 1 above, the following values were chosen for the respective circuit components in FIG. 3(B): $R_1$=1 kΩ; $r_a$=$r_b$=$r_c$=$r_z$=1 kΩ; $C_1$=33 pF; $C_2$=48 pF; C=48 pF; $C_f$=3 pF; $R_f$=8 kΩ; $V_{indiff}$=0.25V; and $V_{outdiff}$=1V. This gives the total capacitance of FDNR circuit 15 of 170 pF, a level that is unachievable with the conventional solutions.

Figure 9:
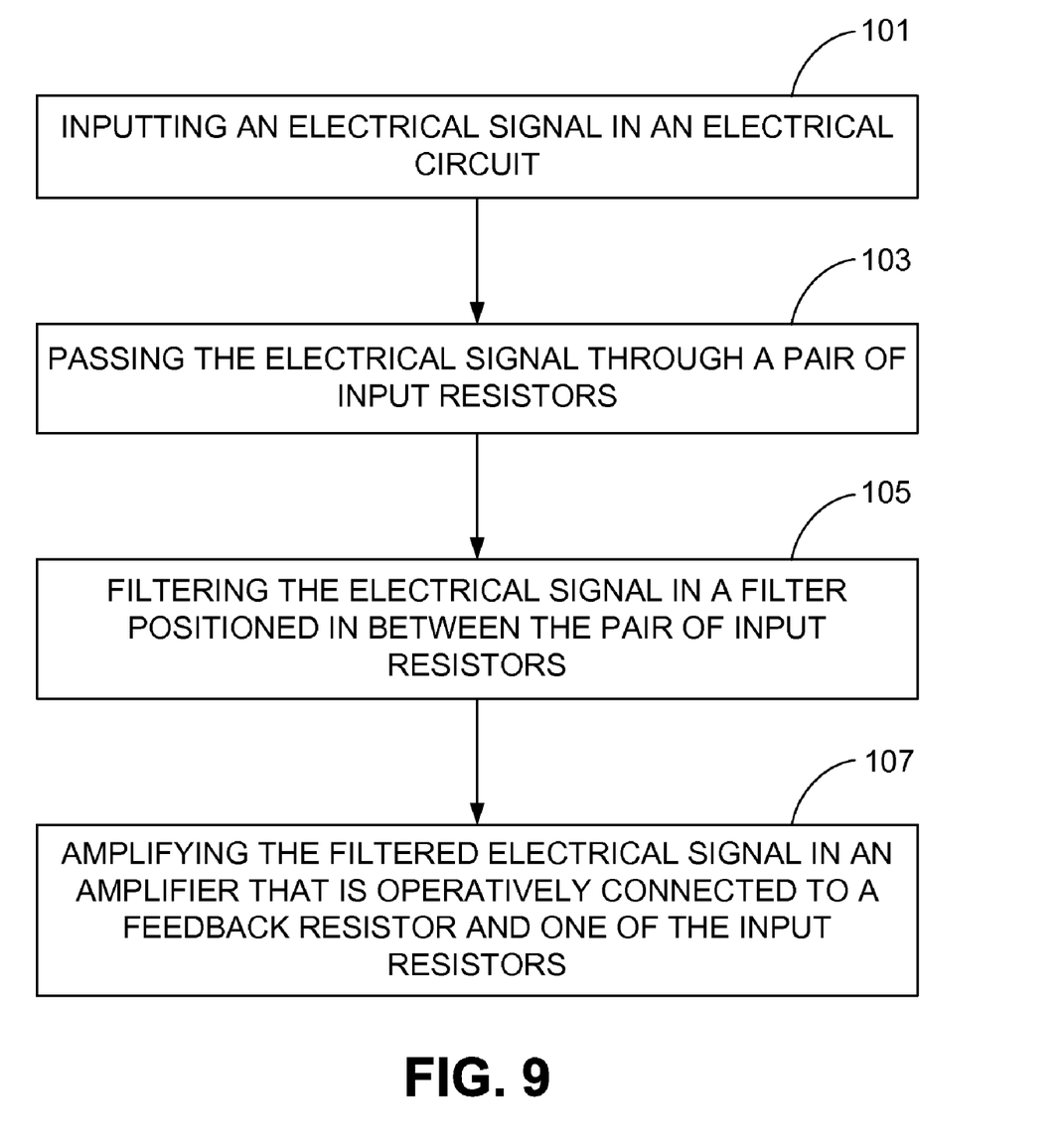
FIG. 9 is a flow diagram illustrating a preferred method according to an embodiment herein.

FIG. 9, with reference to FIGS. 3(A) through 8, is a flow diagram illustrating a method of noise shaping and voltage gain filtering an electrical signal according to an embodiment herein, wherein the method comprises inputting (101) an electrical signal in an electrical circuit 10; passing (103) the electrical signal through a pair of input resistors $R_1$, $R_1$; filtering (105) the electrical signal in a filter 14 positioned in between the pair of input resistors $R_1$, $R_1$ such that the filter 14 creates a short circuit at an out of band region of the electrical signal thereby filtering signal blockers out of the electrical signal, wherein the short circuit causes the filter 14 to refrain from contributing noise to a SNR of the electrical signal; and amplifying (107) the filtered electrical signal in an amplifier 12 that is operatively connected to a feedback resistor $R_f$ and one of the input resistors $R_1$.

The method may further comprise arranging the electrical circuit 10 in each of a plurality of cascading transconductance stages 20a, 20b, 20c, wherein the filter 14 of a first stage 20a is adapted to control a SNR of the electrical signal in successive stages 20b, 20c. Moreover, the method may further comprise configuring the filter 14 with a signal path and a signal blocker path, wherein in the filter 14, the method may further comprise positioning a FDNR circuit 15 only along the signal blocker path; positioning a resistor $r_z$ in series with the FDNR circuit 15; positioning a capacitor C in parallel with the FDNR circuit 15 and the resistor $r_z$; and using the capacitor C to high pass filter noise generated by the FDNR circuit 15 thereby moving the noise to the out of band region of the electrical signal. Additionally, the method may further comprise passing the electrical signal through multiple pairs of input resistors $R_{11}, R_{12}, R_{13} \ldots R_{1(n+1)}$; and positioning a separate the filter 14 in between all pairs of input resistors $R_1$, $R_1$; $R_{1b}$, $R_{1b}$. Moreover, the method preferably comprises configuring the amplifier 12 as any of an operational amplifier, a variable gain amplifier, a trans-resistance amplifier, and a current mode amplifier.

The techniques provided by the embodiments herein may be implemented on an integrated circuit (IC) chip or using printable electronic technologies (not shown). The chip or printable electronic circuit design is created in a graphical computer programming language, and stored in a computer storage medium (such as a disk, tape, physical hard drive, or virtual hard drive such as in a storage access network). If the designer does not fabricate chips or printable electronic circuits or the photolithographic masks used to fabricate chips or printable electronic circuits, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII or CIF) for the fabrication of photolithographic masks, which typically include multiple copies of the chip design in question that are to be formed on a wafer or printed on a suitable substrate. The photolithographic masks are utilized to define areas of the wafer or printable electronic circuits (and/or the layers thereon) to be etched or otherwise processed or printed.

The resulting IC chips or printable electronic circuits can be distributed by the fabricator in raw wafer form (that is, as a single wafer that has multiple unpackaged chips), as a bare die, or in a packaged form or as individual printed circuits or in a sheet or roll of printed circuits. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip might then be integrated with other chips, discrete circuit elements, and/or other signal processing devices as part of either (a) an intermediate product, such as a mother or daughter-board, or (b) an end product. The end product can be any product that includes integrated circuit chip or chips and/or printed circuits, ranging from toys and other low-end applications to advanced computer products having a display, a keyboard or other input device, and a central processor.

Generally, the embodiments herein provide a new technique to realize amplifiers 12, 32 with inherent noise shaped filters 14. The circuits 10, 20, 30 can thus provide amplification of the in-band signal while simultaneously rejecting the out of band signal. The noise of all passive and active components used to realize the filtering operation is shaped and moved out of the pass-band of the filter 14. Therefore, the circuit 10, 20, 30 retains excellent linearity equivalent to that of the amplifier stage 20a. The filtering operation is also achieved before the out of band signals reach the amplifier 12, 32. Hence, the linearity spec on the amplifier 12, 32 is relaxed. The circuits 10, 20, 30 also ensures that all of the filtering components do not contribute any DC offsets or mismatches. Using this technique, high dynamic range filter/amplifiers with high selectivity, low input referred noise, low power consumption can be designed. Noise shaping can also allow the filtering resistor values to be increased. This, in turn, reduces the value of the capacitors $C_1, C_2$ employed resulting in a significant chip area savings.

Accordingly, the embodiments herein provide a technique that enables the implementation of low noise high selectivity filter/amplifier stages 20a with low power consumption and a wide dynamic range. Filters 14 implemented using the technique provided by the embodiments herein achieve:

1. Gain filtering optimized topologies with high selectivity and low noise.
2. The filter 14 attenuates the out-of-band signals before it reaches the amplification stage 12, 32. Hence, the linearity spec of the amplifier 12, 32 is relaxed.
3. All components employed in the filtering section 14 do not contribute any DC-offsets to the signal path.
4. In applications requiring matching (I/Q paths of a wireless receiver) the components of the filter 14 have negligible effect on matching.
5. The noise shaped property of the filter 14 allows the filter 14 to use larger resistances (that are noisier). This, in turn, reduces the size of the capacitors $C_1, C_2$ and hence reduces the overall chip area of the filter 14.
6. Low noise and high linearity that results in a wide dynamic range. The circuitry 10, 20, 30 used to implement the embodiments herein has a negligible effect on degrading noise and linearity.
7. By cascading the stage 20a-20c, power and area scaled higher order filter/amplifier blocks can be implemented.
8. For optimal dynamic range, the amplifier 12, 32 employed can be a variable gain amplifier or a programmable gain amplifier (gain controlled continuously or digitally).

Furthermore, the embodiments can be used in the design/implementation of any receiver/transmitter (wireless, television (TV) tuner, cell phones, and satellite tuners). Moreover, the embodiments herein can also be used in computer diskdrives, hearing aids, modems, wire line applications, or any application that require the use of a low noise filter and amplifier.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A noise shaping and voltage gain filtering electrical circuit comprising:
   an input terminal that receives an input electrical signal;
   a pair of input resistors directly connected to said input terminal;
   a filter positioned in between said pair of input resistors and wherein said filter comprises a Frequency Dependent Negative Resistance (FDNR) circuit, a resistor in series with said FDNR circuit, and a first capacitor in parallel with said FDNR circuit and said resistor;
   a feedback resistor; and
   an amplifier that amplifies said electrical signal, wherein said amplifier is directly connected to said feedback resistor and one of the input resistors, wherein said FDNR circuit comprises a second capacitor for blocking DC offset in said amplifier, wherein when said input terminal receives said input electrical signal, said filter creates a short circuit at an out of band region of said electrical signal thereby filtering signal blockers out of said electrical signal prior to said electrical signal reaching said amplifier, and wherein noise generated by said FDNR circuit and said resistor is high pass filtered by said first capacitor thereby moving said noise to said out of band region of said electrical signal.

2. The circuit of claim 1 arranged in each of a plurality of cascading transconductance stages, wherein said filter of a first stage controls a SNR of said electrical signal in successive stages.

3. The circuit of claim 1, wherein said filter comprises a signal path and a signal blocker path, wherein said FDNR circuit is positioned only along said signal blocker path.

4. The circuit of claim 3, wherein said short circuit causes said filter to refrain from contributing noise to a signal-to-noise ratio (SNR) of said electrical signal.

5. The circuit of claim 1, wherein said pair of input resistors comprises exactly two input resistors.

6. The circuit of claim 1, further comprising multiple said pairs of input resistors, wherein a separate said filter is positioned in between all said pairs of input resistors.

7. The circuit of claim 1, wherein said amplifier comprises any of an operational amplifier, a variable gain amplifier, a trans-resistance amplifier, and a current mode amplifier.

8. A noise shaping and voltage gain filtering third order electrical circuit comprising:

at least one pair of input resistors;

a Frequency Dependent Negative Resistance (FDNR) filter positioned in between said at least one pair of input resistors, wherein said FDNR filter comprises a FDNR circuit, a resistor in series with said FDNR circuit, and a first capacitor in parallel with said FDNR circuit and said resistor;

a feedback resistor; and an amplifier operatively connected to said feedback resistor and said at least one pair of input resistors, wherein said FDNR circuit comprises a second capacitor for blocking DC offset in said amplifier, wherein as an electrical signal is introduced to said electrical circuit, said FDNR filter filters signal blockers out of said electrical signal prior to said electrical signal reaching said amplifier for signal amplification, wherein noise generated by said FDNR circuit and said resistor is high pass filtered by said first capacitor thereby moving said noise to said out of band region of said electrical signal, and wherein a transfer function of said FDNR filter is substantially elliptical in shape.

9. The circuit of claim 8 arranged in each of a plurality of cascading transconductance stages, wherein said FDNR filter of a first stage controls a SNR of said electrical signal in successive stages.

10. The circuit of claim 8, wherein said FDNR filter comprises a signal path and a signal blocker path, wherein said FDNR circuit is positioned only along said signal blocker path.

11. The circuit of claim 10, wherein said FDNR filter does not contribute noise to a signal-to-noise ratio (SNR) of said electrical signal.

12. The circuit of claim 8, wherein said pair of input resistors comprises exactly two input resistors.

13. The circuit of claim 8, further comprising multiple said pairs of input resistors, wherein a separate said FDNR filter is positioned in between all said pairs of input resistors.

14. The circuit of claim 8, wherein said amplifier comprises any of an operational amplifier, a variable gain amplifier, a trans-resistance amplifier, and a current mode amplifier.

15. A method of noise shaping and voltage gain filtering an electrical signal, said method comprising:

inputting an electrical signal in an electrical circuit;

passing said electrical signal through a pair of input resistors;

filtering said electrical signal in a filter positioned in between said pair of input resistors, wherein said filter comprises of a Frequency Dependent Negative Resistance (FDNR) circuit, a resistor in series with said FDNR circuit, and a first capacitor in parallel with said FDNR circuit and said resistor such that said filter creates a short circuit at an out of band region of said electrical signal thereby filtering signal blockers out of said electrical signal, wherein said short circuit causes said filter to refrain from contributing noise to a signal-to-noise ratio (SNR) of said electrical signal; and amplifying the filtered electrical signal in an amplifier that is directly connected to a feedback resistor and one of the input resistors, wherein said FDNR circuit comprises a second capacitor for blocking DC offset in said amplifier, and wherein noise generated by said FDNR circuit and said resistor is high pass filtered by said first capacitor thereby moving said noise to said out of band region of said electrical signal.

16. The method of claim 15, further comprising arranging said electrical circuit in each of a plurality of cascading transconductance stages, wherein said filter of a first stage controls a SNR of said electrical signal in successive stages.

17. The method of claim 15, further comprising configuring said filter with a signal path and a signal blocker path, wherein said FDNR circuit is positioned only along said signal blocker path.

18. The method of claim 17, wherein in said filter, said method further comprises:

using said capacitor to high pass filter noise generated by said FDNR circuit thereby moving said noise to said out of band region of said electrical signal.

19. The method of claim 15, further comprising:

passing said electrical signal through multiple pairs of input resistors; and positioning a separate said filter in between all pairs of input resistors.

20. The method of claim 15, further comprising configuring said amplifier as any of an operational amplifier, a variable gain amplifier, a trans-resistance amplifier, and a current mode amplifier.

* * * * *

UNITED STATES PATENT AND TRADEMARK OFFICE
CERTIFICATE OF CORRECTION

| | | |
|---|---|---|
| PATENT NO. | : 7,592,863 B2 | Page 1 of 1 |
| APPLICATION NO. | : 11/755125 | |
| DATED | : September 22, 2009 | |
| INVENTOR(S) | : Elwan et al. | |

It is certified that error appears in the above-identified patent and that said Letters Patent is hereby corrected as shown below:

On the Title page, next to the listing for the Inventors [75]: please delete "Edward Youssounan" and in its place, please insert --Edward Youssoufian--

Signed and Sealed this

Third Day of November, 2009

David J. Kappos
*Director of the United States Patent and Trademark Office*